United States Patent
Yamashita et al.

(10) Patent No.: US 10,283,316 B2
(45) Date of Patent: May 7, 2019

(54) APERTURE FOR INSPECTING MULTI BEAM, BEAM INSPECTION APPARATUS FOR MULTI BEAM, AND MULTI CHARGED PARTICLE BEAM WRITING APPARATUS

(71) Applicant: NuFlare Technology, Inc., Yokohama-shi (JP)

(72) Inventors: Hiroshi Yamashita, Sagamihara (JP); Munehiro Ogasawara, Hiratsuka (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/665,853

(22) Filed: Aug. 1, 2017

(65) Prior Publication Data
US 2018/0040455 A1   Feb. 8, 2018

(30) Foreign Application Priority Data
Aug. 8, 2016   (JP) .................................. 2016-155739

(51) Int. Cl.
| | | |
|---|---|---|
| H01J 37/244 | (2006.01) | |
| H01J 37/30 | (2006.01) | |
| H01J 37/317 | (2006.01) | |
| H01J 37/153 | (2006.01) | |

(52) U.S. Cl.
CPC ........ H01J 37/244 (2013.01); H01J 37/3007 (2013.01); H01J 37/3177 (2013.01); *H01J 37/153* (2013.01); *H01J 37/3174* (2013.01)

(58) Field of Classification Search
CPC .... H01J 37/244; H01J 37/153; H01J 37/3174; H01J 37/3007; H01J 37/3177

USPC ...................................................... 250/252.1
See application file for complete search history.

(56) References Cited

U.S. PATENT DOCUMENTS

| | | | | |
|---|---|---|---|---|
| 5,502,001 A | * | 3/1996 | Okamoto | G01B 11/0608 |
| | | | | 219/121.69 |
| 5,973,785 A | * | 10/1999 | Okamoto | G01B 11/0608 |
| | | | | 356/401 |
| 2002/0117953 A1 | * | 8/2002 | Kuo | B82Y 10/00 |
| | | | | 313/310 |

(Continued)

FOREIGN PATENT DOCUMENTS

| | | |
|---|---|---|
| JP | 10-261566 A | 9/1998 |
| JP | 11-31657 | 2/1999 |

(Continued)

OTHER PUBLICATIONS

Office Action dated Nov. 6, 2018 in corresponding Korean Patent Application No. 10-2017-0095836, 5 pages.

(Continued)

Primary Examiner — Taeho Jo
(74) Attorney, Agent, or Firm — Oblon, McClelland, Maier & Neustadt, L.L.P.

(57) ABSTRACT

In one embodiment, an aperture for inspecting a multi-beam allows passage of one beam among multi-beams applied in a multi-beam writing apparatus. The aperture includes a scattering layer that is provided with a through-hole through which the one beam passes, and by which the other beams are scattered, and an absorbing layer that is provided with an opening having a diameter greater than the diameter of the through-hole and that absorbs at least some of the beams entering it.

18 Claims, 9 Drawing Sheets

(56) References Cited

U.S. PATENT DOCUMENTS

| | | | | |
|---|---|---|---|---|
| 2007/0145269 A1* | 6/2007 | Buller | ............... | B82Y 10/00 |
| | | | | 250/310 |
| 2008/0001077 A1* | 1/2008 | Nakasugi | ............ | B82Y 10/00 |
| | | | | 250/252.1 |
| 2010/0258719 A1* | 10/2010 | Benner | ............... | H01J 37/09 |
| | | | | 250/306 |
| 2011/0204253 A1* | 8/2011 | Platzgummer | ......... | B82Y 10/00 |
| | | | | 250/396 R |
| 2015/0064934 A1* | 3/2015 | Yoshikawa | ......... | H01J 37/3026 |
| | | | | 438/798 |
| 2016/0071692 A1* | 3/2016 | Ogasawara | ......... | H01J 37/3177 |
| | | | | 250/396 R |
| 2017/0133198 A1* | 5/2017 | Kruit | ................... | H01J 37/28 |

FOREIGN PATENT DOCUMENTS

| | | | | |
|---|---|---|---|---|
| JP | 2944559 | 9/1999 | | |
| JP | 2004171937 A * | 6/2004 | | |
| JP | 2004-355884 | 12/2004 | | |
| JP | 2005-347054 | 12/2005 | | |
| KR | 10-2016-0026788 A | 3/2016 | | |
| WO | WO 2015099527 A1 * | 7/2015 | ............ | H01J 37/244 |

OTHER PUBLICATIONS

Combined Taiwanese Office Action and Search Report dated Aug. 9, 2018 in Patent Application No. 106124099 (with English translation of categories of cited documents).

* cited by examiner

APERTURE FOR INSPECTING MULTI BEAM, BEAM INSPECTION APPARATUS FOR MULTI BEAM, AND MULTI CHARGED PARTICLE BEAM WRITING APPARATUS

CROSS REFERENCE TO RELATED APPLICATION

This application is based upon and claims benefit of priority from the Japanese Patent Application No. 2016-155739, filed on Aug. 8, 2016, the entire contents of which are incorporated herein by reference.

FIELD

The present invention relates to an aperture for inspecting multi beam, a beam inspection apparatus for multi beam, and a multi charged particle beam writing apparatus.

BACKGROUND

As LSI circuits are increasing in density, the linewidth of circuits of semiconductor devices is becoming smaller. Examples of methods of producing an exposure mask (also called a reticle that is used in a stepper or a scanner) to be used to form a circuit pattern for such a semiconductor device include an electron-beam lithography, which potentially has high resolution.

As an electron-beam writing apparatus, as a replacement for a conventional single beam writing apparatus that deflects a single beam and applies the beam to a desired portion on a substrate, development of a writing apparatus using a multi-beam is being promoted. By using a multi-beam, as compared to the case of writing a pattern with a single electron beam, many beams can be applied, and therefore the throughput can be significantly improved. In the multi-beam type writing apparatus, for example, an electron beam emitted from an electron gun is passed through an aperture member having a plurality of holes to form a multi-beam. Blanking control of each beam is performed by a blanking plate. Beams that are not blocked are reduced by an optical system, and are applied to a substrate placed on a movable stage.

In the multi-beam writing apparatus, it is required to inspect whether the beam current and focus have desired values, whether on/off control can be performed by the blanking electrodes, and the like, for each beam. Conventionally, beams have been inspected by scanning a Faraday cup while switching the beam turned on by the blanking electrodes one by one. However, a multi-beam is composed of many (for example, about 260,000) beams. There is a problem in that when such an inspection is repeated for the number of beams, the inspection takes a long time.

DETAILED DESCRIPTION

In one embodiment, an aperture for inspecting a multi-beam allows passage of one beam among multi-beams applied in a multi-beam writing apparatus. The aperture includes a scattering layer that is provided with a through-hole through which the one beam passes, and by which the other beams are scattered, and an absorbing layer that is provided with an opening having a diameter greater than the diameter of the through-hole and that absorbs at least some of the beams entering it.

Embodiments of the present invention will be described with reference to the drawings.

Figure 1:
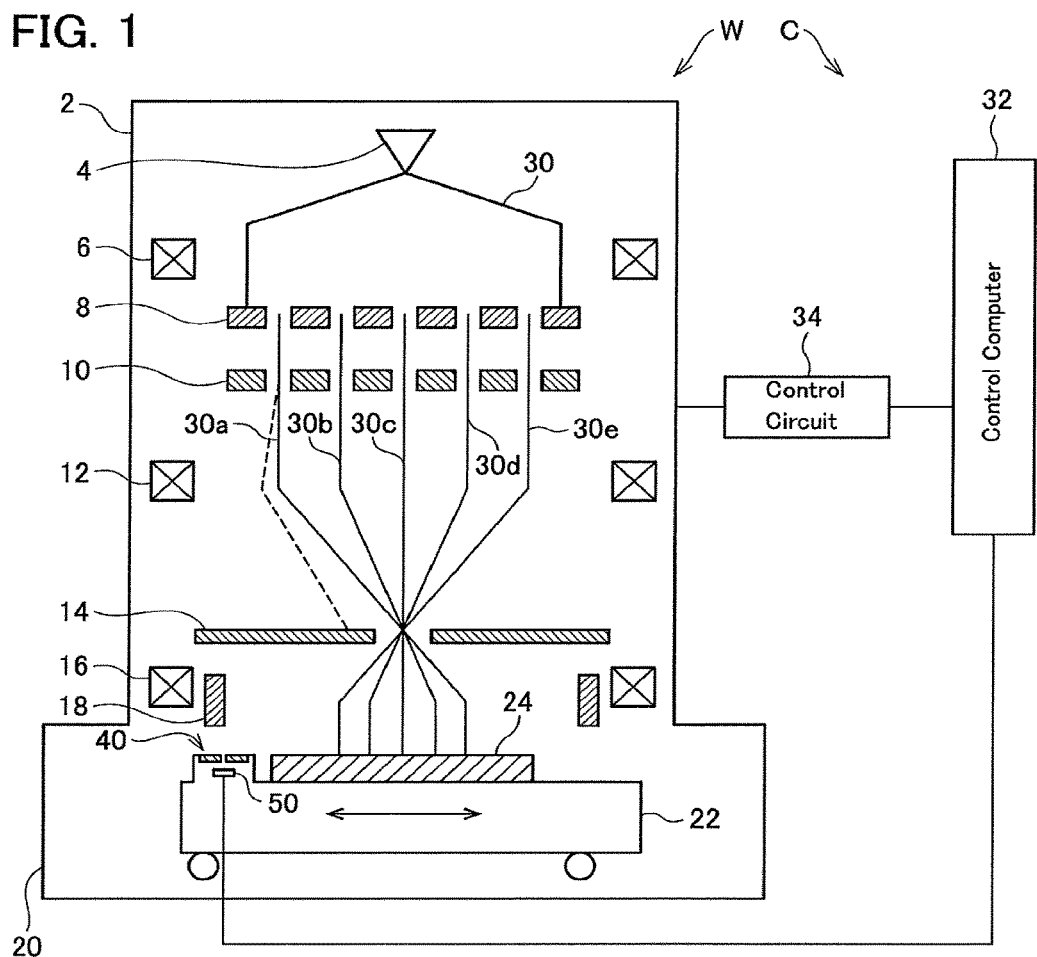
FIG. 1 is a schematic view of a multi charged particle beam writing apparatus according to an embodiment of the present invention.

FIG. 1 is a schematic view of a multi charged particle beam writing apparatus provided with a beam inspection apparatus for a multi-beam according to an embodiment of the present invention. In this embodiment, a configuration using an electron beam as an example of a charged particle beam will be described. However, the charged particle beam is not limited to the electron beam, and may be any other charged particle beam such as an ion beam.

This writing apparatus includes a writing unit W that applies an electron beam to a substrate 24 on which a pattern is exposed to write a desired pattern, and a control unit C that controls the operation of the writing unit W.

The writing unit W has an electron beam lens barrel 2 and a writing chamber 20. An electron gun 4, an illumination lens 6, an aperture member 8, a blanking aperture array 10, a reducing lens 12, a limiting aperture member 14, an object lens 16, and a deflector 18 are disposed in the electron beam lens barrel 2.

An XY stage 22 is disposed in the writing chamber 20. The substrate 24 on which a pattern is written is placed on the XY stage 22. Examples of the substrate 24 on which a pattern is written include a wafer and a mask for exposure with which a pattern is transferred to a wafer using a reduced projection type exposure apparatus such as a stepper or a scanner using excimer laser as a light source or an extreme ultraviolet ray exposure apparatus (EUV).

A beam inspection apparatus for a multi-beam that has an aperture for inspecting a multi-beam 40 (hereinafter referred to as "inspection aperture 40") and a current detector 50 is disposed on the XY stage 22 at a position different from a position at which the substrate 24 is placed. The inspection aperture 40 is preferably located at the same height position as the substrate 24. The inspection aperture 40 has a height adjustment mechanism (not shown) so as to be at the same height as the substrate 24.

Figure 2:
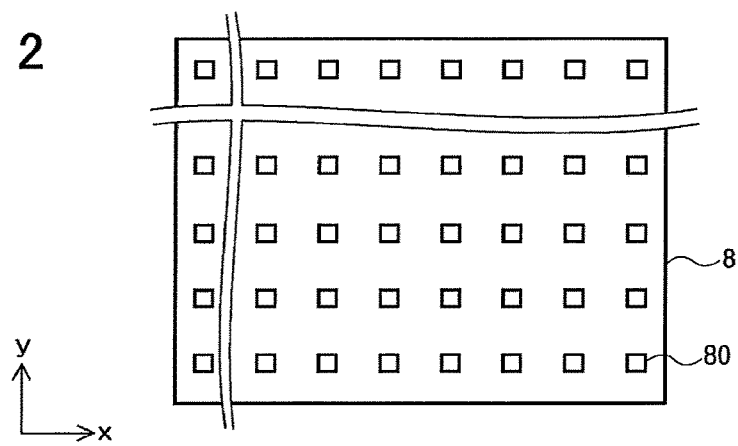
FIG. 2 is a schematic view of an aperture member.

An electron beam 30 emitted from the electron gun 4 illuminates the entire aperture member 8 almost vertically owing to the illumination lens 6. FIG. 2 is a conceptual view showing the configuration of the aperture member 8. m columns (y direction)×n rows (x direction) (m, n≥2) of holes (openings) 80 are formed in the aperture member 8 in a matrix at a predetermined arrangement pitch. For example, 512 columns×512 rows of holes 80 are formed. The holes 80 are of the same rectangular shape with the same dimensions. The holes 80 may be of the same circular shape with the same diameter.

The electron beam 30 illuminates a region on the aperture member 8 including all the holes 80. Parts of the electron beam 30 passes through the holes 80, thereby forming multi-beams 30a to 30e shown in FIG. 1.

In FIG. 2, the holes 80 are arranged in two or more rows (x direction) and two or more columns (y direction). However, the present invention is not limited to this. For example, either rows or columns (x or y direction) may be plural and the other may be singular. The arrangement of the holes 80 is not limited to a lattice pattern with rows and columns as shown in FIG. 2. For example, vertically adjacent holes may be alternately arranged in a staggered pattern.

Through-holes are formed in the blanking aperture array 10 in alignment with the positions of the holes 80 of the aperture member 8. A blanker composed of a pair of two electrodes is disposed in each of the through-holes. The electron beams 30a to 30e passing through the through-holes are deflected independently by electric field applied from the blankers. Each beam is blanking-controlled by this deflection. In this way, the blanking aperture array 10 performs blanking deflection on each beam of the multi-beam passing through the plurality of holes 80 of the aperture member 8.

The beam size and arrangement pitch of the multi-beams 30a to 30e passing through the blanking aperture array 10 are reduced by the reducing lens 12, and the multi-beams 30a to 30e go toward a center hole formed in the limiting aperture member 14. The paths of electron beams deflected by the blankers of the blanking aperture array 10 are displaced, and the electron beams deviate from the center hole of the limiting aperture member 14 and are blocked by the limiting aperture member 14. On the other hand, electron beams not deflected by the blankers of the blanking aperture array 10 pass through the center hole of the limiting aperture member 14.

In this way, the limiting aperture member 14 blocks electron beams that are deflected so as to be brought to a beam OFF state by electrodes of the blanking aperture array 10. Beams passing through the limiting aperture member 14 from when the beams are turned ON to when the beams are turned OFF serve as electron beams corresponding to one shot.

The electron beams 30a to 30e passing through the limiting aperture member 14 are focused by the object lens 16 to form a pattern image of a desired reduction ratio on the substrate 24. The beams (the entire multi-beam) passing through the limiting aperture member 14 are deflected at once in the same direction by the deflector 18, and are applied to the substrate 24.

Multi-beams applied at a time are ideally arranged at a pitch obtained by multiplying the arrangement pitch of the plurality of holes 80 of the aperture member 8 by the desired reduction ratio described above. The writing apparatus performs writing operation in a raster scan manner in which shot beams are consecutively applied, and in writing a desired pattern, necessary beams are controlled to be ON by blanking control in accordance with the pattern. When the XY stage 22 is moving continuously, the locations onto which the beams are applied are controlled by the deflector 18 such that the locations follow the movement of the XY stage 22.

The control unit C has a control computer 32 and a control circuit 34. The control computer 12 performs a plurality of steps of data conversion processing on the writing data to generate shot data specific to the apparatus, and outputs the shot data to the control circuit 34. In the shot data, for example, the exposure dose of each shot and the position coordinates are defined. The control circuit 34 divides the exposure dose of each shot by the current density to obtain the exposure time t. When the corresponding shot is performed, the control circuit 34 applies a deflection voltage to the corresponding blankers of the blanking aperture array 10 such that beams are turned ON for the exposure time t.

The control circuit 34 calculates the amount of deflection such that each beam is deflected to the position (coordinate) indicated by the shot data, and applies a deflection voltage to the deflector 18. The multi-beams shot at that time are thereby collectively deflected.

In such a writing apparatus, inspection whether the beam current and focus have desired values, whether the blankers of the blanking aperture array 10 can apply a desired voltage to perform on/off control, and the like is performed for each of many electron beams that make up a multi-beam. This inspection is performed using a beam inspection apparatus for a multi-beam having an inspection aperture 40 and a current detector 50.

Figure 3:
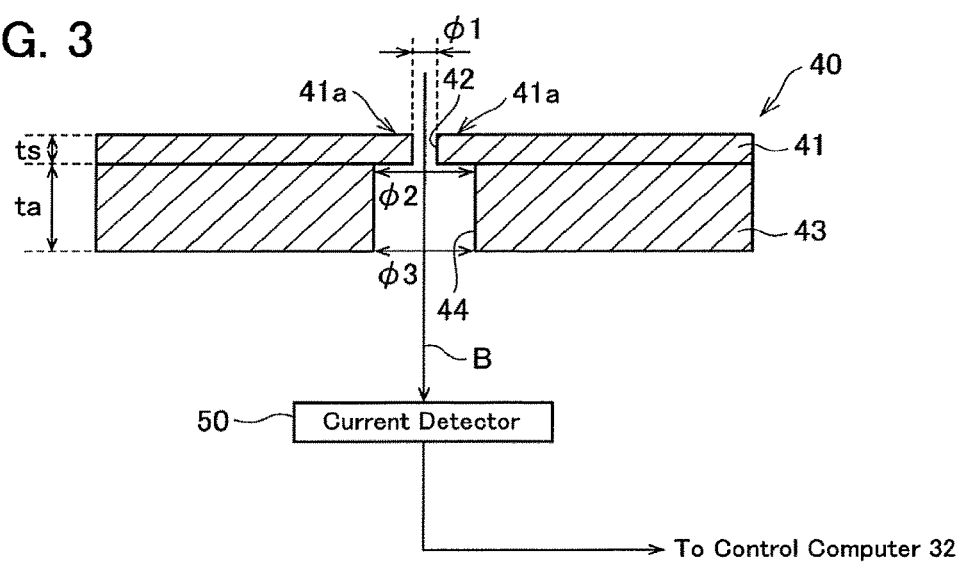
FIG. 3 is a schematic view of a beam inspection apparatus for a multi-beam according to the embodiment.
Figure 4:
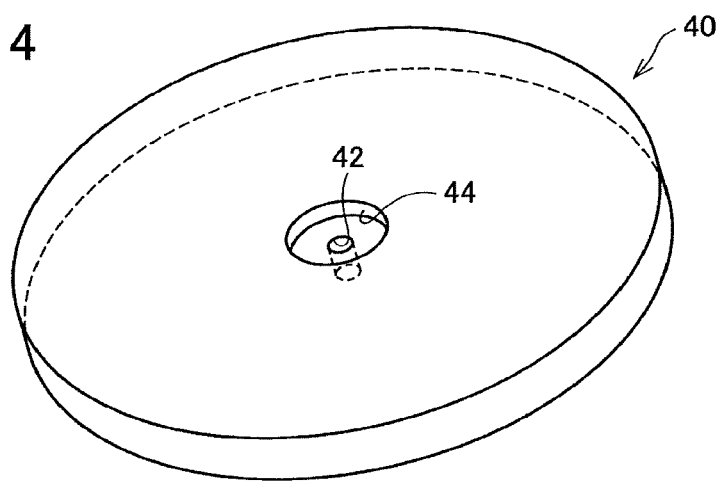
FIG. 4 is a perspective view of an aperture for inspecting a multi-beam according to the embodiment.
Figure 5:
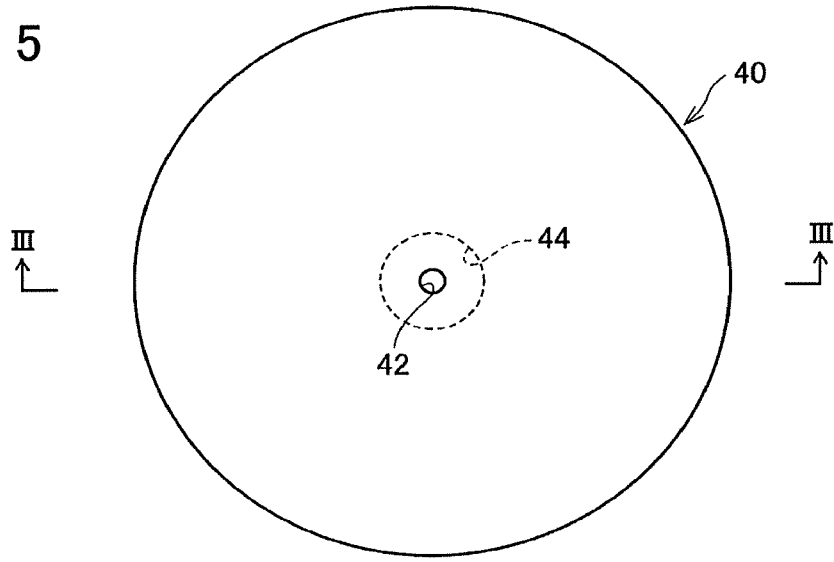
FIG. 5 is a plan view of the aperture for inspecting a multi-beam according to the embodiment.

The configuration of the beam inspection apparatus for a multi-beam will be described with reference to FIG. 3 to FIG. 5. FIG. 3 is a schematic configuration diagram of the beam inspection apparatus for a multi-beam. FIG. 4 is a perspective view of the inspection aperture 40 as seen from the lower surface side. FIG. 5 is a plan view of the inspection aperture 40 as seen from the upper surface side. The inspection aperture 40 shown in FIG. 3 is a sectional end view taken along line III-III of FIG. 5.

The inspection aperture 40 has a scattering layer 41 and an absorbing layer 43. The scattering layer 41 is provided on the top of the absorbing layer 43. The inspection aperture 40 has, for example, a circular planar shape, and a through-hole is formed along the central axis. This through-hole consists of an opening 44 that is formed in the central part of the absorbing layer 43, and a through-hole 42 that is formed in the central part of the scattering layer 41 and communicates with the opening 44.

When making the inspection aperture 40, for example, a thin film of a heavy metal giving high stopping power such as platinum or tungsten is prepared, and an opening 44 is formed on the lower surface side thereof by etching using an FIB (focused ion beam). Next, a through-hole 42 having a diameter less than that of the opening 44 is formed in the bottom of the opening 44 by etching using an FIB. Of the heavy metal thin film, the part in which the opening 44 is formed corresponds to the absorbing layer 43, and the part in which the opening 42 is formed corresponds to the scattering layer 41. The order of processing is not limited to this.

The thickness ts of the through-hole 42 is determined by the diameter (inside diameter) $\phi 1$ of the through-hole 42 and the limit processing depth. For example, when the aspect ratio of the limit processing depth is 10, $ts \leq 10 \times \phi 1$.

The diameter φ1 of the through-hole 42 preferably satisfies the following condition: S<φ1<P−S, where P is the beam pitch of the multi-beams on the substrate 24, and S is the size of (one) beam. When the diameter φ1 is greater than the beam size S, the entire one electron beam can pass (pass without being scattered) through the through-hole 42, and the S/N ratio can be further improved. The diameter φ1 is preferably as great as possible so that the beam can be found easily and so that the hole is not blocked by contaminant or foreign matter.

Figure 6:
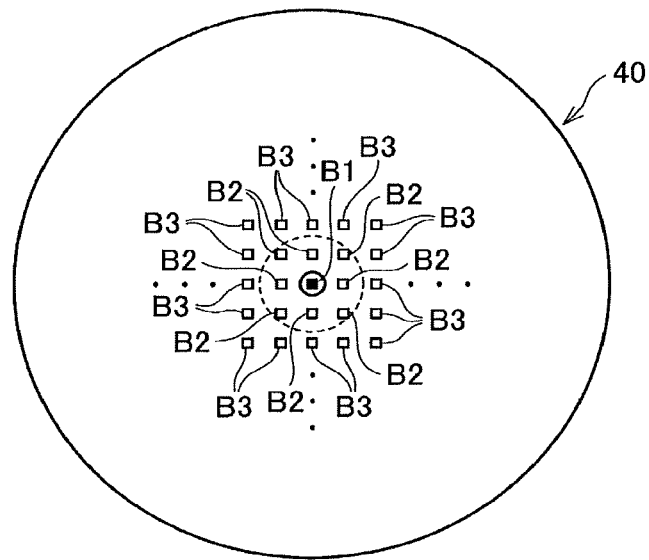
FIG. 6 is a plan view of the aperture for inspecting a multi-beam irradiated with a multi-beam.
Figure 7:
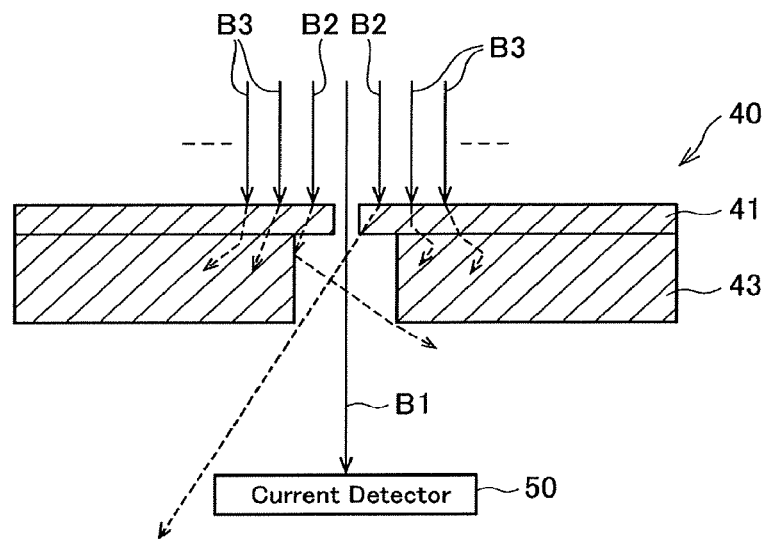
FIG. 7 shows a multi-beam applied to the aperture for inspection.

On the other hand, when the diameter φ1 is less than P−S, (parts of) two adjacent beams do not pass through the through-hole 42 at the same time when multi-beams are scanned. Therefore, the through-hole 42 can allow only one electron beam among the multi-beams to pass therethrough. For example, as shown in FIG. 6 and FIG. 7, when the electron beam B1 passes through the through-hole 42, the electron beams B2 adjacent to the electron beam B1 do not overlap the through-hole 42.

The electron beam passing through the through-hole 42 and the opening 44 (the electron beam B in FIG. 3, the electron beam B1 in FIG. 7) is incident on the current detector 50, and beam current is detected. For example, an SSD (semiconductor detector (solid-state detector)) can be used as the current detector 50. The result of detection by the current detector 50 is notified to the control computer 32.

The absorbing layer 43 is a layer that absorbs electrons entering through the scattering layer 41. It is preferable that the sum of the thickness to of the absorbing layer 43 and the thickness is of the scattering layer 41 be greater than or equal to the Grun range (the depth at which the energy of electrons becomes almost zero) of the electron beam. When the thickness of the scattering layer 41 is greater than the Grun Range, the scattering layer 41 also functions as an absorbing layer.

The diameter φ2 of the upper part of the opening 44 formed in the absorbing layer 43 preferably satisfies the following condition: φ1≤φ2≤4P−S. By making the diameter φ2 less than or equal to 4P−S, electron beams adjacent to the electron beam passing through the through-hole 42 are scattered by the scattering layer 41, and electron beams two electron beams away from the electron beam passing through the through-hole 42 are applied directly above the absorbing layer 43, are scattered by the scattering layer 41, then enter the absorbing layer 43, and are absorbed, and therefore the S/N ratio can be further improved. The diameter φ2 can be greater than or equal to 4P−S, but is preferably as small as possible.

For example, as shown in FIG. 6 and FIG. 7, when the electron beam B1 passes through the through-hole 42, the electron beams B2 adjacent to the electron beam B1 (eight electron beams B2 around the electron beam B1) are applied to the scattering layer 41. Although some of them are reflected by the surface of the scattering layer 41, most of them enter the scattering layer 41 as shown by dashed lines and are scattered. The scattered electrons pass through the scattering layer 41, some of them go straight in a vacuum, some of them are reflected by the surface of the absorbing layer 43, some of them enter the absorbing layer 43, and they (most of them) do not reach the current detector 50. The electron beams B3 two or more electron beams away from the electron beam B1 are scattered by the scattering layer 41 as shown by dashed lines. The scattered electrons enter the absorbing layer 43 and are absorbed.

The diameter φ3 of the lower part of the opening 44 is greater than or equal to the diameter φ2 of the upper part. The upper limit of the diameter φ3 is determined by the thickness ta of the absorbing layer 43 and processing conditions. For example, when the aspect ratio is 5, φ3≤ta/5. In general, the side peripheral wall of the opening 44 has a tapered shape due to the etching by FIB processing. When etching is performed from the lower part, the upper part is larger in diameter than the lower part. Therefore, it can be said that the diameter φ2 is the minimum diameter of the opening 44, and the diameter φ3 is the maximum diameter of the opening 44.

When inspecting beams, for example, beams are deflected by the deflector 18 in the XY direction on the stage 22 on which the inspection aperture 40 and the current detector 50 are located, and multi-beams are scanned. As shown in FIG. 6 and FIG. 7, one beam B1 passes through the through-hole 42 (and the opening 44), and beam current is detected by the current detector 50 located below the inspection aperture 40.

Eight electron beams B2 around the electron beam B1 passing through the through-hole 42 are scattered by passing through the scattering layer 41, and they (most of them) do not reach the current detector 50. The electron beams B3 two or more electron beams away from the electron beam B1 pass through the scattering layer 41 while being scattered, are absorbed by the absorbing layer 43, and therefore do not reach the current detector 50. The current detector 50 can detect the beam current of one electron beam B1 with a high degree of accuracy.

The control computer 32 determines whether the beam current has a predetermined value from the detection result of the current detector 50. By scanning multi-beams and sequentially switching the electron beam passing through the through-hole 42, the inspection of each electron beam of the multi-beams can be performed in a short time and with a high degree of accuracy. By scanning beams in the ON state and scanning beams in the OFF state, it can be easily determined whether ON/OFF control can be performed by each blanker of the blanking aperture array 10, and defective beams can be detected. The beam sharpness can be measured, and focus adjustment, astigmatism adjustment, and the like can be performed.

The inspection of beams may be performed before or during the writing.

Figure 8:
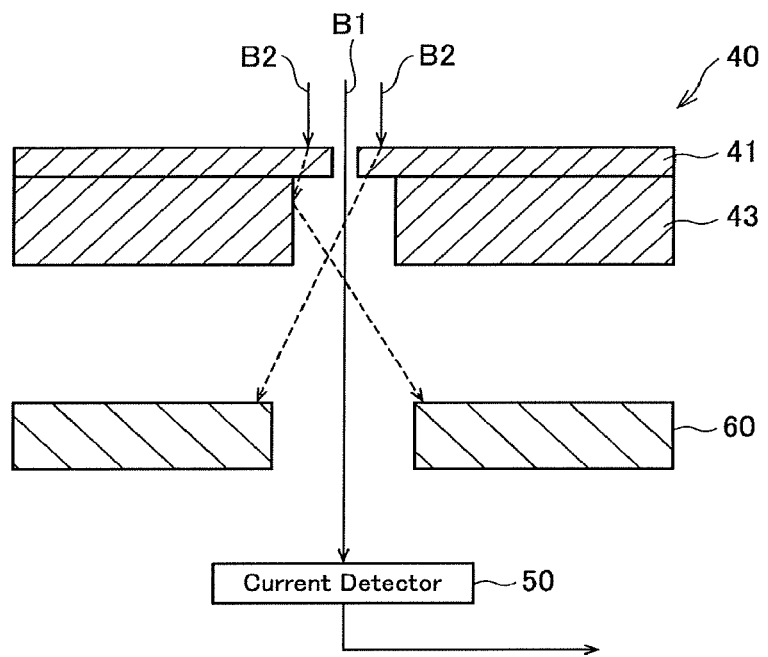
FIG. 8 is a schematic view of a beam inspection apparatus for a multi-beam according to another embodiment.

As shown in FIG. 8, a limiting aperture 60 may be provided between the inspection aperture 40 and the current detector 50. Electrons scattered by the scattering layer 41 are blocked by the limiting aperture 60, scattered electrons having small scattering angles are prevented from being incident on the current detector 50, and the S/N ratio can be improved. The limiting aperture 60 can be made, for example, of carbon. The opening diameter of the limiting aperture 60 is determined by considering the electron scattering angle, contrast, and the like.

Figure 9A:
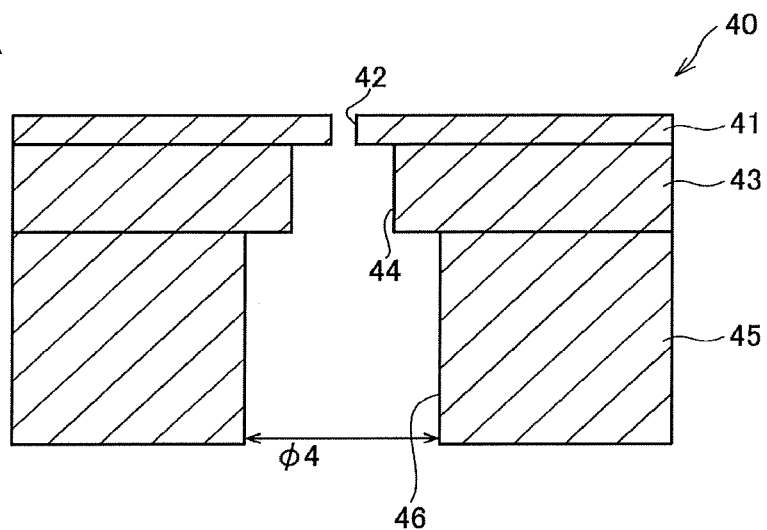
FIGS. 9A and 9B are sectional end views of apertures for inspecting a multi-beam according to another embodiment.

Since the scattering layer 41 and the absorbing layer 43 have small film thicknesses, in order to improve handlability, as shown in FIG. 9A, a holder 45 that holds the scattering layer 41 and the absorbing layer 43 may be provided. The holder 45 has, for example, a thickness of about 10 to 20 times the absorbing layer 43. For example, a film of a heavy metal such as platinum or tungsten is prepared, and an opening 46 is formed on the lower surface side thereof by etching using an FIB. Next, an opening 44 having a diameter smaller than that of the opening 46 is formed in the bottom of the opening 46, and then a through-hole 42 is formed by etching using an FIB. An inspection aperture 40 integral with a holder 45 can thereby be made.

Figure 9B:
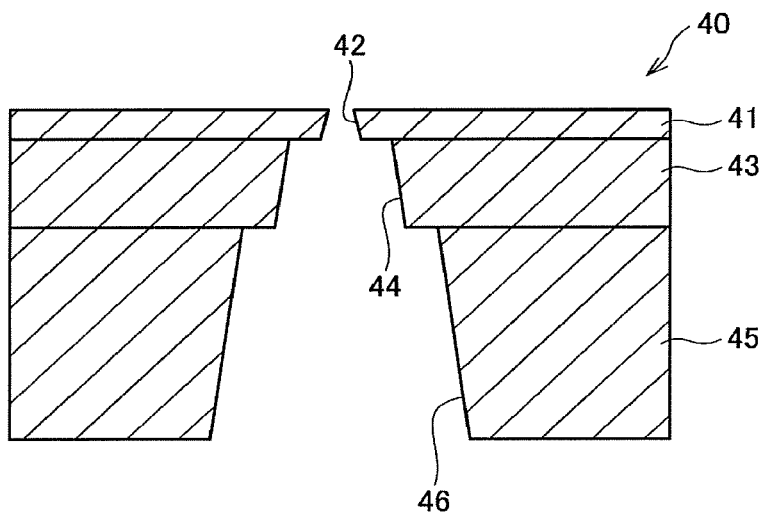

Although, in the above-described embodiment, the side walls of the through-hole 42 and the openings 44 and 46 are depicted to be vertical walls, the etching shape can be a tapered shape as shown in FIG. 9B.

Although, in the above-described embodiment, an integrated inspection aperture 40 in which the scattering layer 41 and the absorbing layer 43 are formed of the same material has been described, the scattering layer 41 and the absorbing layer 43 may be formed of different materials. When the scattering layer 41 and the absorbing layer 43 are formed of different materials, the heat transfer from the scattering layer 41 to the absorbing layer 43 is low, the temperature of the scattering layer 41 easily increases, and contaminant or foreign matter is less likely to adhere to the through-hole 42.

Although, in the above-described embodiment, an example has been described in which electron beams adjacent to the electron beam passing through the through-hole 42 are applied to the scattering layer 41 and are scattered, and electron beams two or more electron beams away from the electron beam passing through the through-hole 42 are absorbed by the absorbing layer 43, the diameter φ2 may be increased so that electron beams one or two electron beams away from the electron beam passing through the through-hole 42 are applied to the scattering layer 41 and are scattered, and electron beams three or more electron beams away from the electron beam passing through the through-hole 42 are absorbed by the absorbing layer 43. However, in this configuration, as compared to the configuration in which beams two or more electron beams away from the electron beam passing through the through-hole 42 are absorbed by the absorbing layer 43, the S/N ratio may decrease.

The thickness to of the absorbing layer 43 is generally the penetration depth, and is specifically defined as the Grun range, but may be determined by the Bethe range (Grun Range<Bethe Range).

Figure 10:
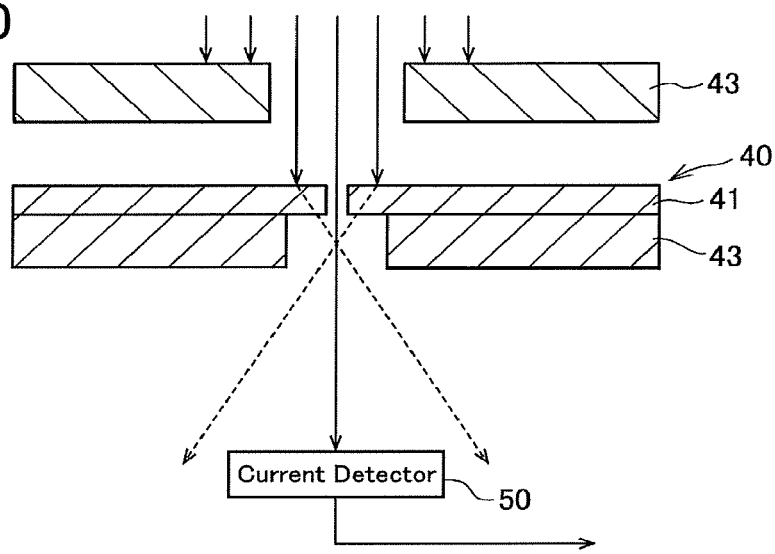
FIG. 10 is a schematic view of a beam inspection apparatus for a multi-beam according to another embodiment.

As shown in FIG. 10, another absorbing layer 43 may be provided above the inspection aperture 40. By disposing the absorbing layer 43 above the inspection aperture 40, the absorbing layer 43 integrated with the scattering layer 41 in the inspection aperture 40 can be made thin, and the workability can be improved.

Figure 11:
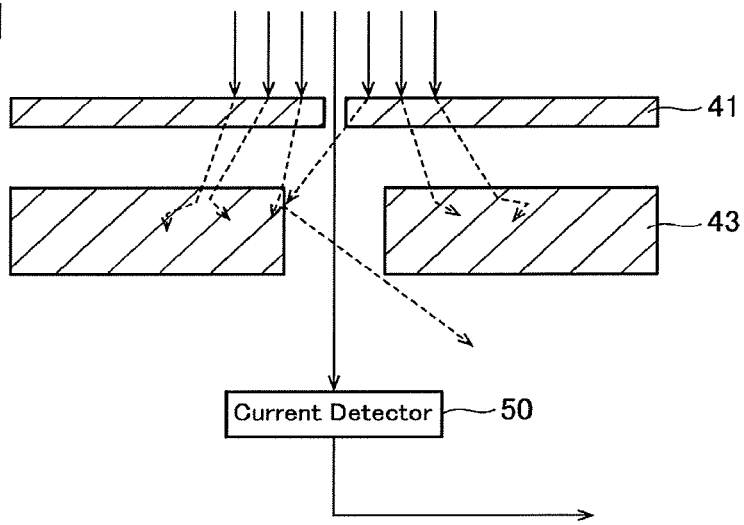
FIG. 11 is a schematic view of a beam inspection apparatus for a multi-beam according to another embodiment.
Figure 12:
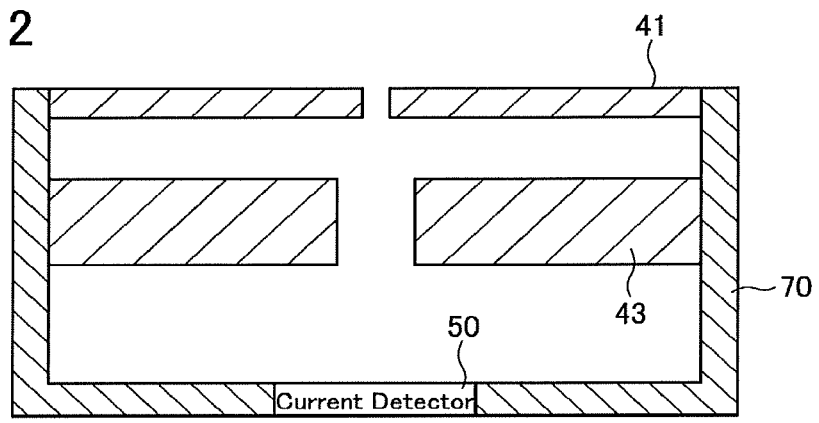
FIG. 12 is a schematic view of a beam inspection apparatus for a multi-beam according to another embodiment.

Although, in the above-described embodiment, the scattering layer 41 and the absorbing layer 43 are integrated, as shown in FIG. 11, the scattering layer 41 and the absorbing layer 43 may be separate bodies, and the absorbing layer 43 may be spaced apart from and below the scattering layer 41. In this case, the absorbing layer 43 has the same function as the limiting aperture, and the larger the distance between the scattering layer 41 and the absorbing layer 43, the higher the S/N ratio. Similarly, the larger the distance between the absorbing layer 43 and the current detector 50, the higher the S/N ratio. As the absorbing layer 43, the limiting aperture described above may be used. As shown in FIG. 12, a configuration may be employed in which a holder 70 that holds the current detector 50 holds the scattering layer 41 and the absorbing layer 43.

Figure 13:
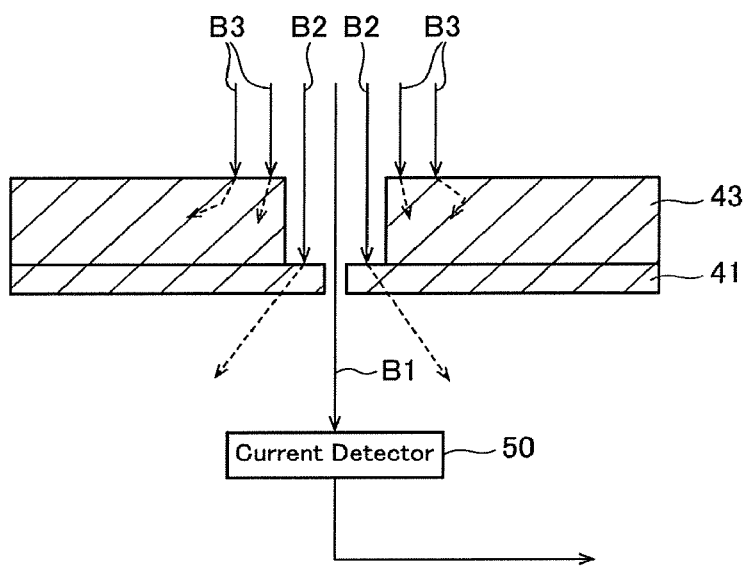
FIG. 13 is a schematic view of a beam inspection apparatus for a multi-beam according to another embodiment.

Although, in the above-described embodiment, the scattering layer 41 is located on the upper side (on the upstream side in the beam traveling direction) of the absorbing layer 43, the scattering layer 41 may be located on the lower side of the absorbing layer 43 as shown in FIG. 13. Also in the case of such a configuration, eight electron beams B2 around the electron beam B1 passing through the through-hole 42 are scattered by passing through the scattering layer 41, and they (most of them) do not reach the current detector 50. The electron beams B3 two or more electron beams away from the electron beam B1 are absorbed by the absorbing layer 43, and do not reach the current detector 50. Therefore, the current detector 50 can detect the beam current of one electron beam B1 with a high degree of accuracy.

Figure 14:
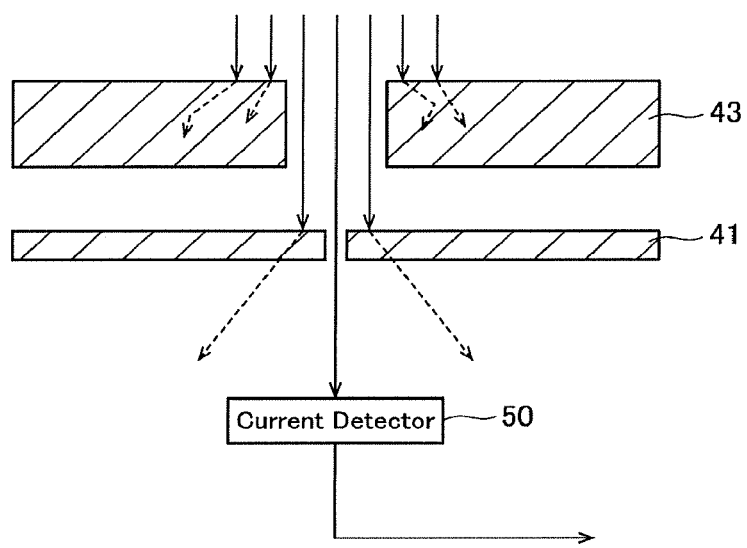
FIG. 14 is a schematic view of a beam inspection apparatus for a multi-beam according to another embodiment.
Figure 15:
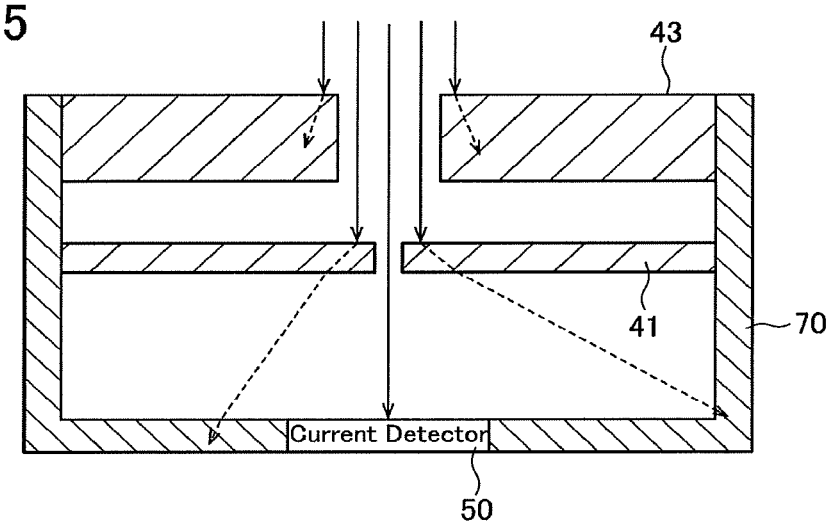
FIG. 15 is a schematic view of a beam inspection apparatus for a multi-beam according to another embodiment.

As shown in FIG. 14, the scattering layer 41 and the absorbing layer 43 may be separate bodies, and the absorbing layer 43 may be spaced apart from and above the scattering layer 41. As shown in FIG. 15, a configuration may be employed in which a holder 70 that holds the current detector 50 holds the scattering layer 41 and the absorbing layer 43. In this case, the holder 70 can function as an absorbing layer that absorbs electrons scattered by the scattering layer 41. A limiting aperture 60 or an absorbing layer 43 may be disposed below the scattering layer 41.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An aperture for inspecting a multi-beam that allows passage of one beam among multi-beams applied in a multi-beam writing apparatus, the aperture comprising:
   a scattering layer that is provided with a through-hole through which the one beam passes, and by which the other beams are scattered; and
   an absorbing layer that is provided with an opening having a diameter greater than the diameter of the through-hole and that absorbs at least some of the beams entering it,
   wherein a minimum diameter φ1 of the through-hole satisfies a following condition:

$S<\phi1<P-S$, where S is a beam size of beams that make up the multi-beam, and P is a beam pitch.

2. The aperture according to claim 1, wherein the absorbing layer is provided below the scattering layer.

3. The aperture according to claim 2, wherein the absorbing layer is provided apart from the scattering layer.

4. The aperture according to claim 2, wherein the absorbing layer and the scattering layer are connected to each other, and the opening communicates with the through-hole.

5. The aperture according to claim 4, wherein the opening decreases in diameter toward the scattering layer.

6. The aperture according to claim 1, wherein the absorbing layer is provided above the scattering layer.

7. The aperture according to claim 6, wherein the absorbing layer is provided apart from the scattering layer.

8. The aperture according to claim 6, wherein the absorbing layer and the scattering layer are connected to each other, and the opening communicates with the through-hole.

9. The aperture according to claim 1, wherein the absorbing layer is provided above and below the scattering layer.

10. The aperture according to claim 1, wherein the minimum diameter φ2 of the opening satisfies the following condition:

$\phi1\leq\phi2\leq4P-S$.

11. The aperture according to claim 1, wherein a sum of a thickness of the scattering layer and a thickness of the absorbing layer is greater than or equal to the Grun range of the beam.

12. The aperture according to claim 1, wherein a sum of a thickness of the scattering layer and a thickness of the absorbing layer is greater than or equal to the Bethe range of the beam.

13. A beam inspection apparatus for a multi-beam comprising:
    an aperture for inspecting a multi-beam including a scattering layer that is provided with a through-hole through which one beam among multi-beams applied in a multi-beam writing apparatus passes, and by which the other beams are scattered, and an absorbing layer that is provided with an opening having a diameter greater than the diameter of the through-hole and that absorbs at least some of the beams entering it; and
    a current detector that detects a beam current of the beam passing through the through-hole and the opening,
    wherein a minimum diameter $\phi1$ of the through-hole satisfies a following condition:

$$S<\phi1<P-S,$$

where S is a beam size of beams that make up the multi-beam, and P is a beam pitch.

14. The apparatus according to claim 13, further comprising a limiting aperture provided between the aperture for inspecting a multi-beam and the current detector.

15. The apparatus according to claim 14, wherein the limiting aperture is made of carbon.

16. The apparatus according to claim 13, wherein the minimum diameter $\phi2$ of the opening satisfies the following condition:

$$\phi1 \le \phi2 \le 4P-S.$$

17. The apparatus according to claim 13, wherein the sum of the thickness of the scattering layer and the thickness of the absorbing layer is greater than or equal to the Grun range of the beam, or is greater than or equal to the Bethe range of the beam.

18. A multi charged particle beam writing apparatus comprising:
    a movable stage on which a substrate on which a pattern is written is placed;
    an emitter that emits a charged particle beam;
    an aperture plate that has a plurality of openings and that forms multi-beams by letting a region including the plurality of openings be irradiated with the charged particle beam and letting parts of the charged particle beam pass through the plurality of openings;
    a blanking aperture array that has a plurality of blankers that perform blanking deflection on corresponding beams among the multi-beams passing through the plurality of openings of the aperture plate; and
    a beam inspection apparatus for a multi-beam provided on the stage,
    wherein the beam inspection apparatus for a multi-beam includes
    an aperture for inspecting a multi-beam including a scattering layer that is provided with a through-hole through which one beam among the multi-beams passes, and by which the other beams are scattered, and an absorbing layer that is provided with an opening having a diameter greater than the diameter of the through-hole and that absorbs at least some of the beams entering it, and
    a current detector that detects the beam current of the beam passing through the through-hole and the opening of the absorbing layer,
    wherein a minimum diameter $\phi1$ of the through-hole satisfies a following condition:

$$S<\phi1<P-S,$$

where S is a beam size of beams that make up the multi-beam, and P is a beam pitch.

* * * * *